(12) United States Patent
Ong et al.

(10) Patent No.: US 8,558,161 B2
(45) Date of Patent: Oct. 15, 2013

(54) LENS HAVING MULTIPLE CONIC SECTIONS FOR LEDS AND PROXIMITY SENSORS

(75) Inventors: Chi Boon Ong, Singapore (SG); Yufeng Yao, Singapore (SG); Sze Ping Ong, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 460 days.

(21) Appl. No.: 12/853,566

(22) Filed: Aug. 10, 2010

(65) Prior Publication Data
US 2012/0037793 A1 Feb. 16, 2012

(51) Int. Cl.
*H01J 3/14* (2006.01)
(52) U.S. Cl.
USPC ................ 250/216; 250/221; 362/297
(58) Field of Classification Search
USPC ............... 250/216, 221; 362/298, 299, 300
See application file for complete search history.

(56) References Cited

U.S. PATENT DOCUMENTS

| 5,013,144 | A | 5/1991 | Silverglate |
| 6,835,923 | B2 * | 12/2004 | Hamalainen et al. ..... 250/227.11 |
| 7,153,000 | B2 | 12/2006 | Park |
| 7,618,163 | B2 | 11/2009 | Wilcox |
| 2004/0207999 | A1 * | 10/2004 | Suehiro et al. .................. 362/84 |

FOREIGN PATENT DOCUMENTS

JP 8148722 6/1996
WO WO-2008/003176 1/2008

* cited by examiner

*Primary Examiner* — Tony Ko (57) ABSTRACT

A lens element comprising a base, a plurality of lens sections and a top lens section is disclosed. The plurality of lens sections are formed above a planar parallel to the base with each of the lens sections being positioned rotationally symmetric about an optical axis. The lens sections define a dome shape with every adjoining lens sections being conjugated with each other. A top lens section is formed at the center above the other lens sections and conjugated therewith. All of the lens sections are conjugated with each of its neighboring lens sections. Each of the lens sections has a optical property to direct light towards a target point. The target point may be positioned along the optical axis.

19 Claims, 8 Drawing Sheets

LENS HAVING MULTIPLE CONIC SECTIONS FOR LEDS AND PROXIMITY SENSORS

BACKGROUND

A proximity sensor is a sensor device configured to detect the presence of a nearby object without any physical contact. A proximity sensor typically comprises a transmitter and a receiver. The transmitter is usually configured to emit radiation in a predetermined direction. The radiation may be reflected toward the receiver due to the presence of an external object. There are two main types of proximity sensors. The first type is referred to as a radio frequency type proximity sensor and the second type is an optical type proximity sensor. Accordingly, the radiation may be light or a wireless electromagnetic signal. The transmitters used in optical proximity sensors are usually light emitting diodes (referred to hereinafter as "LED") and the receivers are usually photodetectors. LEDs and photodetectors are generally considered to be low cost components, especially compared to wireless transceivers.

BRIEF DESCRIPTION OF THE DRAWINGS

Illustrative embodiments are described herein by way of example, not by way of limitation, and reference is made to the following drawings, in which the same or like reference numerals between figures refer to the same or similar elements.

DETAILED DESCRIPTION

Figure 1:
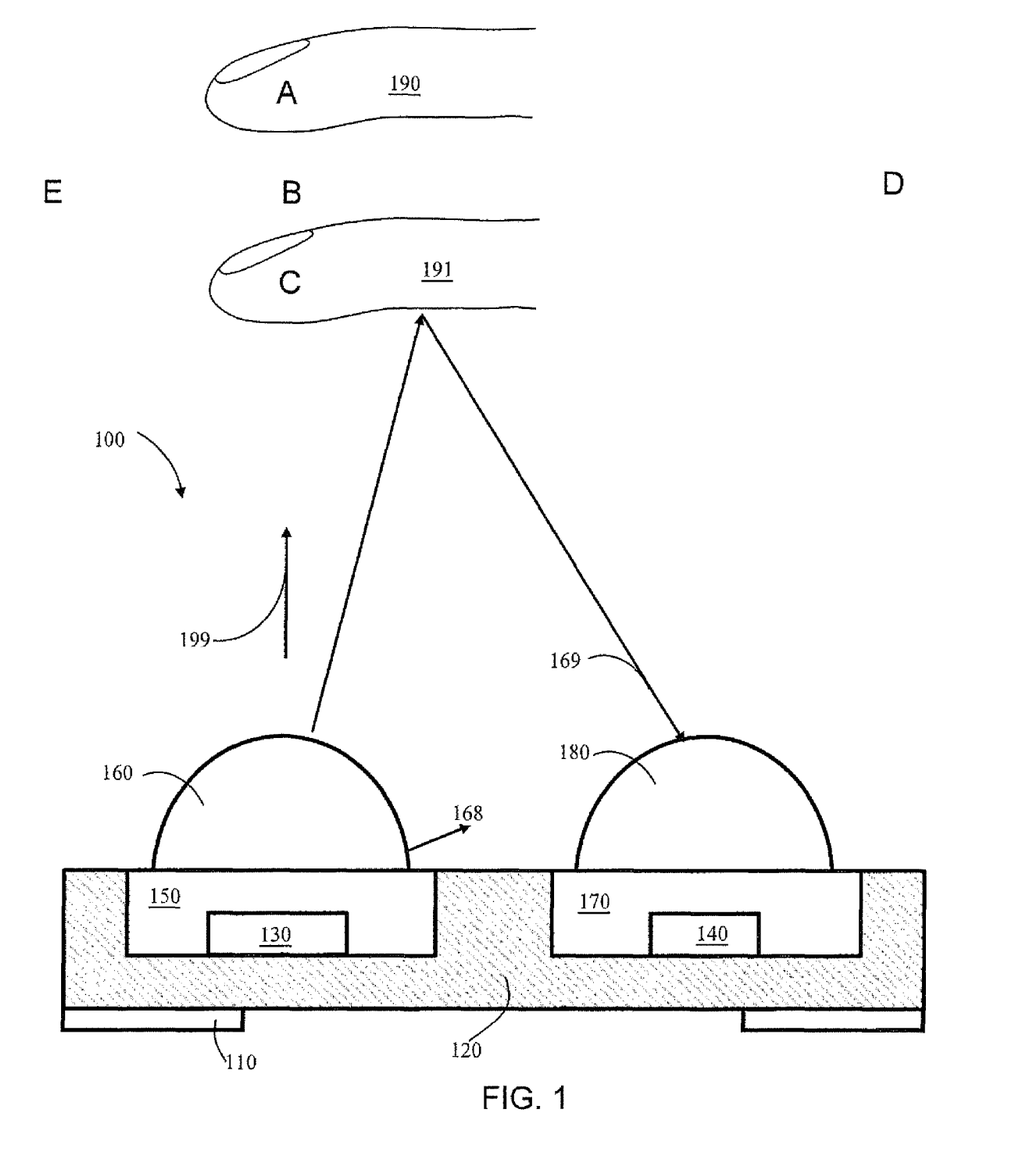
FIG. 1 illustrates a cross sectional view of a proximity sensor and how the proximity sensor works.

FIG. 1 illustrates how a proximity sensor 100 works. The proximity sensor 100 may comprise a body or a substrate 120, a transmitter die 130, a receiver die 140, bond pads 110, lens element 160 and 180. The lens element 160 may comprise a base 150 encapsulating the transmitter die 130. Similarly, the lens element 180 may comprise a base 170 encapsulating the receiver die 140. Typically, the lens element 160 and 180 can be made from an epoxy material. The substrate 120 may be a printed circuit board (referred to hereinafter as "PCB") or a premolded component. A pre-molded component may comprise lead frames, and bond pads adaptable for the transmitter die 130 or receiver die 140 to be attached thereon.

The transmitter die 130 may be an LED operable to emit visible or invisible radiation, such as infrared light or ultraviolet light. The receiver die 140 can be a photodetector, such as a photodiode, a phototransistor, or other similar component. The lens element 160, such as a single dome lens, may be configured to collimate the radiation emitted by the transmitter die 130 along an optical axis 199. In use, any external object positioned at a predetermined distance from the proximity sensor 100 may redirect or reflect the radiation emitted from the transmitter die 130 towards the receiver die 140.

For the convenience of illustration, the various elements in FIG. 1 are not shown to actual scale. The positions of A-E and the external objects 190-191 are shown larger than actual proportion for better understanding purpose. In actual size, the positions A-E and the external objects 190-191 are much further away from the proximity sensor 100 compared to FIG. 1.

In FIG. 1, the lens element 160 is configured to collimate the light emitted from the transmitter die 130 to a specific direction along the optical axis 199, or more precisely targeting position B. External objects 190 and 191 located along the direction such as positions A and C can be detected. For example, at position C, external object 191 redirects ray 169 towards the detector die 140 through the lens element 180. At certain position too far from the targeted point B, for example, beyond position A, the reflected light may be too weak to be detected or not reflected at all.

Typically, the range of detectability may be limited. For example, external objects at positions D and E, which are located far from the optical axis 199 may not be detected. In order to detect external objects 190-191 at position far from the optical axis 199 such as the positions D and E, the lens element 160 may be required to direct radiation to all directions.

This may not be efficient from an energy perspective, because in some occasions proximity sensors are typically configured to detect external objects 190-191 from certain directions. For example, ray 168 may not be reflected by external object. On the contrary, ray 168 may create cross talk because ray 168 may be received directly at the receiver die 140 through lens element 180. Depending on the application, the external object 190-191 to be detected may be limited to a specific range. Therefore, for such applications radiation emitted towards a direction far from optical axis 199 may not be utilized.

Figure 2A:
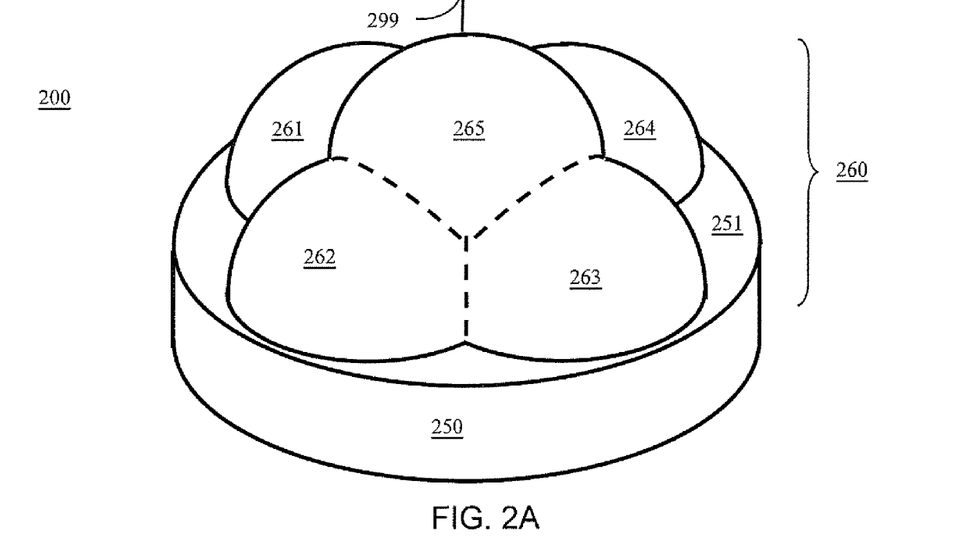
FIG. 2A illustrates a perspective view of a lens element comprising five lens sections.
Figure 2B:
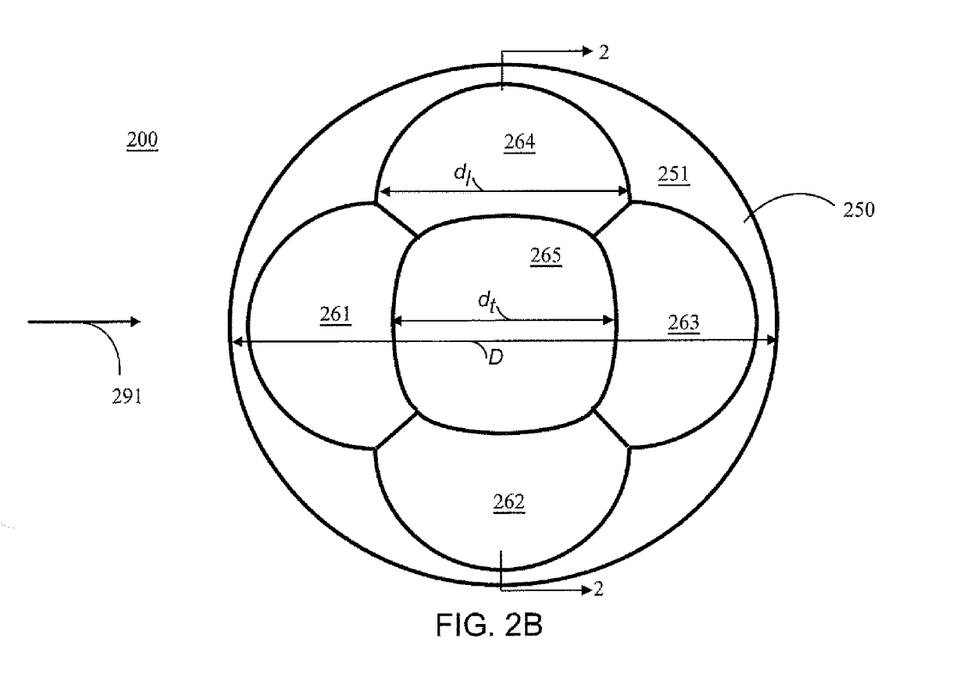
FIG. 2B illustrates a top view of a lens element comprising five lens sections.
Figure 2C:
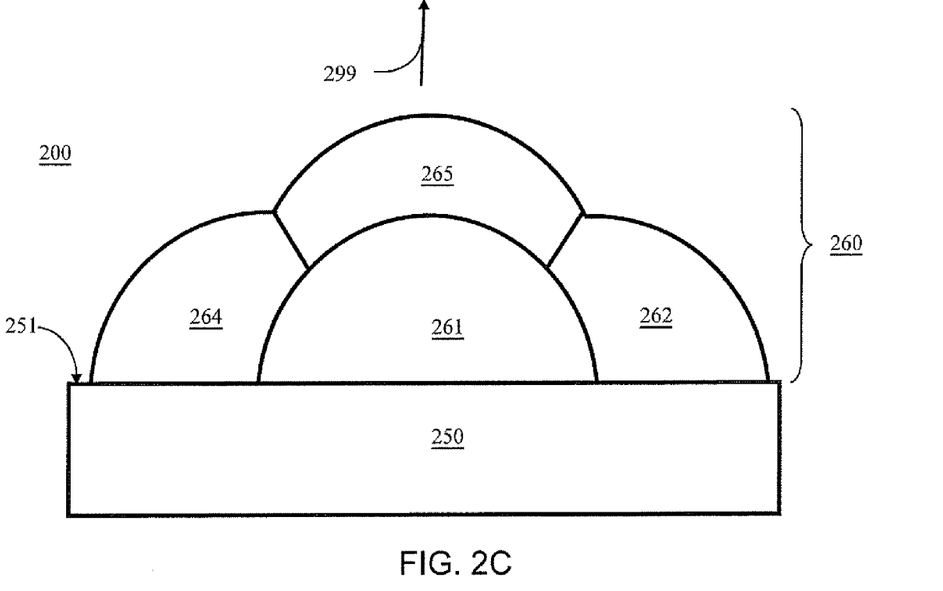
FIG. 2C illustrates a side view of a lens element comprising five lens sections.

FIG. 2A illustrates a perspective view of a lens element 200 used in light source package. A top view of the lens element 200 is illustrated in FIG. 2B. FIG. 2C illustrates a side view of the lens element 200 viewed from the direction 291 (See FIG. 2B). Referring to FIG. 2A-2C, the lens element 200 comprises a base 250 and a lens portion 260. The lens portion 260 further comprises a plurality of lens sections 261-264 and a top lens section 265. The lens element 200 is configured to direct light along an optical axis 199 (see FIG. 1), which is substantially perpendicular to the base 250.

The discussion now refers to FIG. 2A-2D. The plurality of lens sections 261-264 may be formed planarly parallel and above the base 250. The lens sections 261-264 may be positioned rotationally symmetrical about the optical axis 299. Each of the successive lens sections 261-264 may be conjugated with all its neighboring lens sections 261-264.

The word "conjugate" can mean overlap and combine, which may be more than joining the lens together. For example, as shown by the embodiment in FIG. 2A, each of the lens sections 261-264 may originally define a dome shapes lens but as the lens sections 261-264 are conjugated, the lens sections 261-264 may not define a complete dome shape because neighboring lens sections 261-264 may be overlapped and combined together. By conjugating the lens sections 261-264, the overall diameter D of the lens element 200 can be made smaller. In one embodiment, by conjugating the lens sections 261-264, diameter D of a lens element 200 may be reduced to 2 mm, which is much smaller compared to 5 mm in diameter D of another embodiment in which the lens sections 261-264 are merely joined at the side or at the fringe of the lens sections 261-264 to maintain the entire dome shape.

The plurality of lens sections 261-264 may be positioned on a plane planarly parallel to the base 250 to form a ring. The ring formed by plurality of lens sections 261-264, and the base 250 may be coaxially aligned. The lens sections 261-264 may define a first layer of the lens element 200. Additional layers of lens sections 261-264 may be formed above lens section 261-264. For example, a top lens section 265 may be overlappingly above the center of the lens sections 261-264.

The top lens section 265 may be conjugating all the lens sections 261-264. As the top lens section 265 may define a second layer of the lens element 200, the top lens section 265 may be joined to the lens section 261-264 through the top portion of the lens sections 261-264. As shown in FIG. 2A, as the boundary of the top lens 265 conjugating with the lens sections 261-265, the top lens section 265 may not define a complete dome shape. The intersections between lens sections 261-265 and top lens section 265 may be filled by a filler section 269 as shown in FIG. 2C.

Generally, the lens sections 261-264 may be made identical. However, in some circumstances where the focal point of each of the lens section 261-264 varies differently, the lens sections 261-264 may not be of similar sizes. The top lens 265 may have a different size compared to the lens sections 261-264 but the diameter $d_t$ of the top lens 265 may be ranging from 20% to 500% compared to the diameter $d_l$ of the lens sections 261-264. In the embodiment shown in FIG. 2A-2D, the ratio of the diameter $d_t$ of the top lens 265 to the diameter $d_l$ of the lens sections 261-264 may be 89%.

When the number of the lens sections 261-264 is significantly larger than the number of the top lens 265, the ratio may be larger. Another scenario in which ratio becomes larger is when majority of light needs to be focus to one location through the top lens 265. In such circumstance, the top lens 265 may be made larger in diameter $d_t$ so that majority the light may pass through the top lens 265 while the diameter $d_l$ of the lens sections 261-265 may be made smaller. The ratio may be a parameter to be decided by considering the needs of the application.

The lens element 200 may be fabricated using any conventional molding process, such as transfer molding, injection molding, compression molding, or other similar molding process. The lens element 200 may be made using an epoxy material or a silicon material. The base 250 may be larger than the lens section 261-264. Therefore, a portion of the base 250 may be extended to form a flange 251. The existence of the flange 251 may improve the reliability of the lens element 200. This is because with a flange 251 and the base 250, air may unlikely be trapped during the molding process.

Figure 2D:
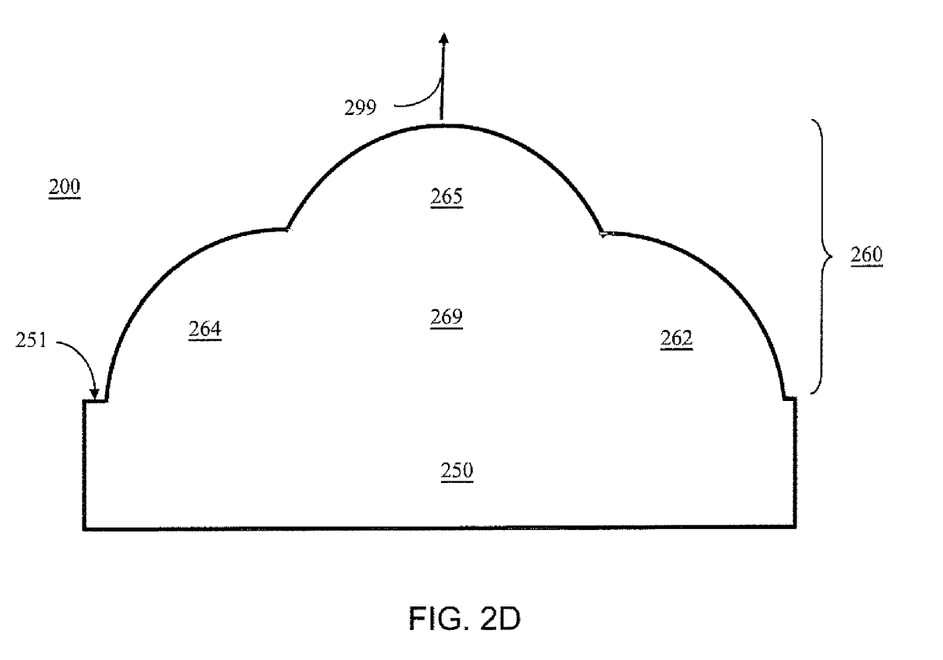
FIG. 2D illustrates a cross sectional view of a lens element comprising five lens sections.

FIG. 2D illustrates a cross sectional view of the lens element 200 taken along line 2-2 shown in FIG. 2B. Referring now to FIG. 2D, although the lens sections 262, 264 and the top lens 265 are sections of a dome shape, the boundary of each section may not be visible. This may be due to the fact that the lens element 200 is being molded in a single piece component having overlapping edges of adjoining lens domes.

The entire interior volume of the lens element 200 may be fully encapsulated. As a result, the gap between each of the lens sections 261-265 may define a filler section 269. As appreciated by one with ordinary skill in the art, the filler section 269 may be formed at intersections of the top lens section 265 and the plurality of lens sections 261-264.

Figure 3A:
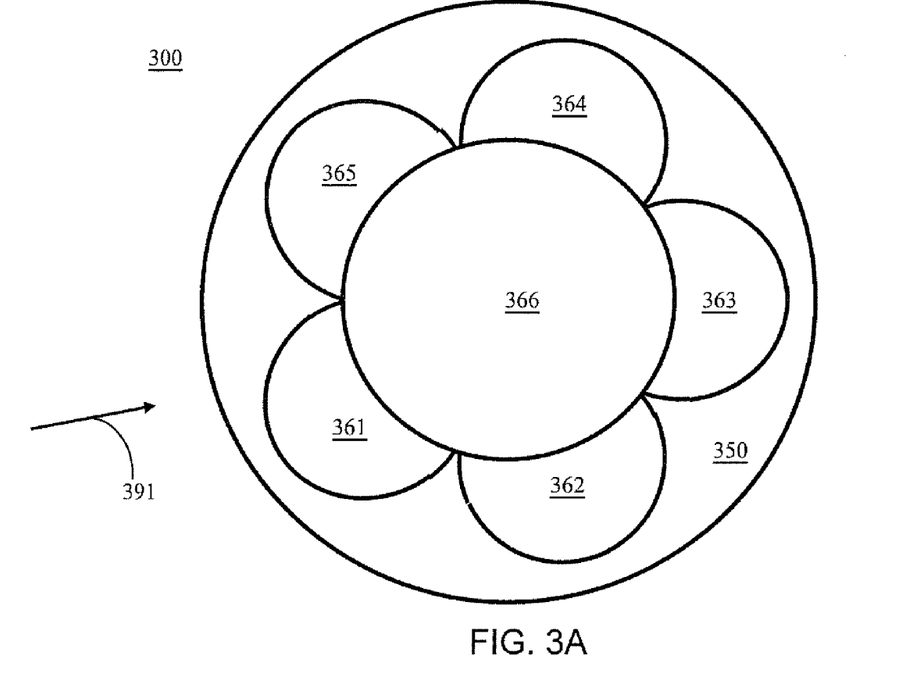
FIG. 3A illustrates a top view of a lens element comprising six lens sections.
Figure 3B:
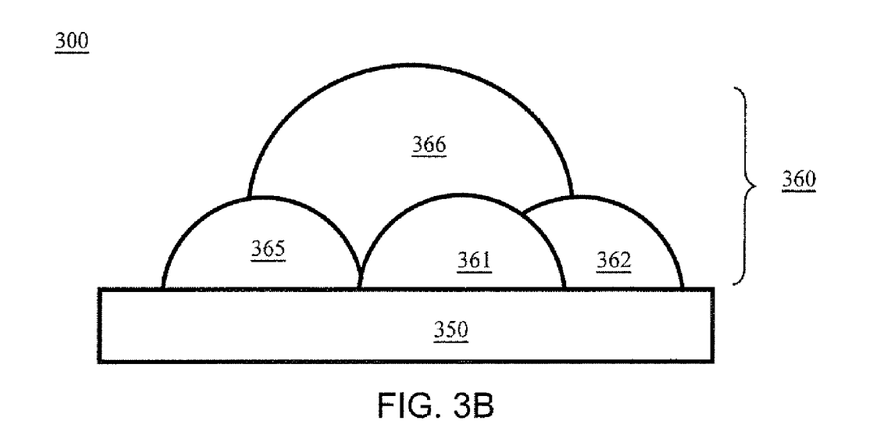
FIG. 3B illustrates a side view of a lens element comprising six lens sections.
Figure 4A:
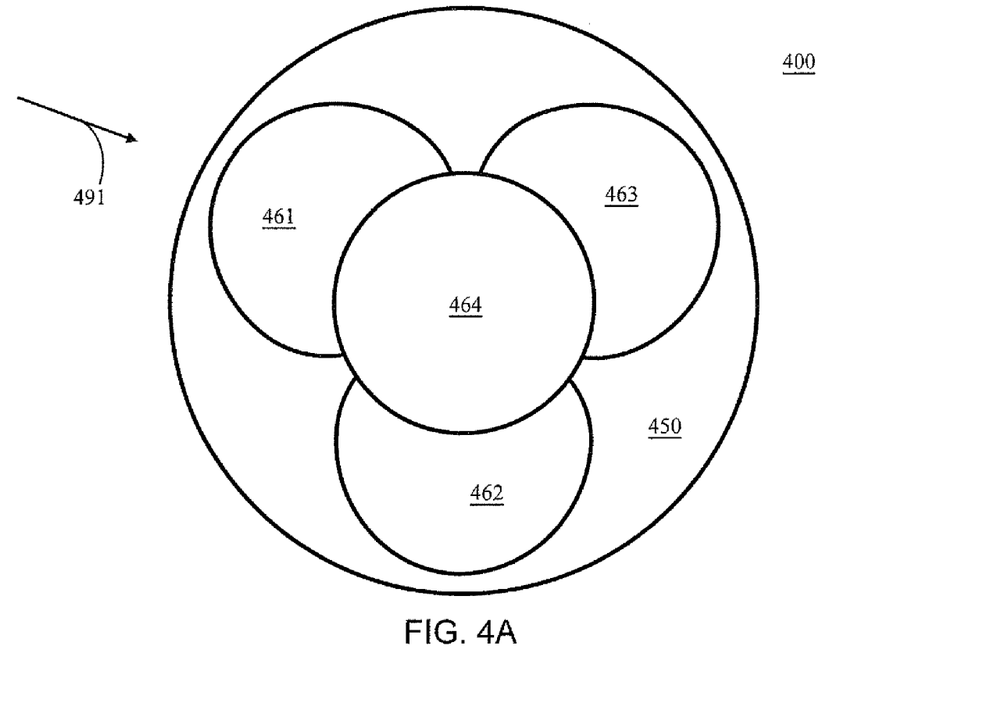
FIG. 4A illustrates a top view of a lens element comprising four lens sections.

The number of lens sections 261-265 in the lens element 200 may vary depending on the designs requirements. FIG. 3A and FIG. 4A show lens elements 300 having six lens sections 361-366 and lens element 400 having four lens sections 461-464, respectively. FIG. 3B shows a side view of the lens element 300, viewed from the direction 391 shown in FIG. 3A. Referring now to FIGS. 3A and 3B, the lens element 300 comprises a base 350 and a lens portion 360. The lens portion 360 further comprises a plurality of lens sections 361-365 and a top lens section 366. The lens element 300 is similar to the lens element 200, except that the lens element 300 comprises five lens sections 361-365.

In the embodiment shown in FIG. 3A-3B, the ratio of the diameter $d_t$ of the top lens 366 to diameter $d_l$ of the lens sections 361-365 may be 160%. The top lens 366 may be relatively much larger than the lens section 361-365. As a result, upon conjugating with the top lens 366, the lens section 361-365 may be partial dome shape because 30% of the lens sections 361-365 may be conjugated.

Figure 4B:
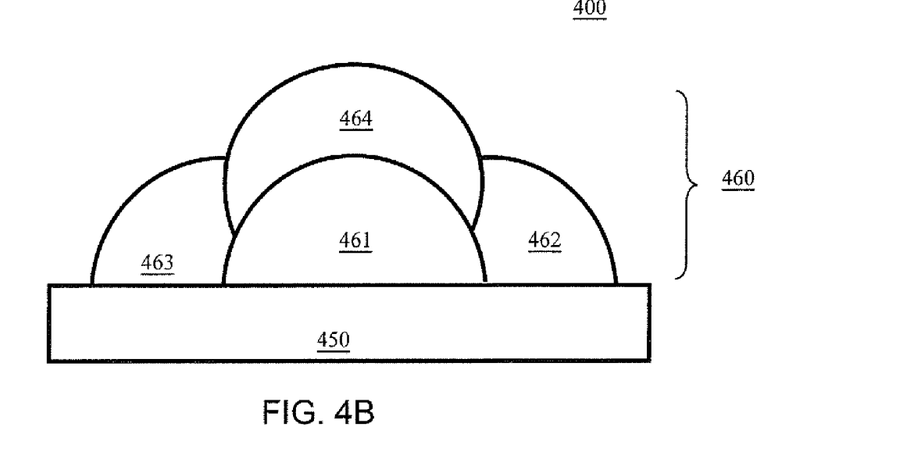
FIG. 4B illustrates a side view of a lens element comprising four lens sections.

FIG. 4B shows a side view of the lens element 400, viewed from the direction 491 shown in FIG. 4A. Referring now to FIGS. 4A and 48, the lens element 400 comprises a base 450 and a lens portion 460. The lens portion 460 further comprises a plurality of lens sections 461-463 and a top lens section 464. The lens element 400 is similar to the lens element 200 and the lens element 300, except that lens element 400 comprises four lens sections 461-464. In the embodiment shown in FIG. 4A-4B, the ratio of the diameter $d_t$ of the top lens 464 to diameter $d_l$ of the lens sections 461-463 may be 105%.

Figure 5:
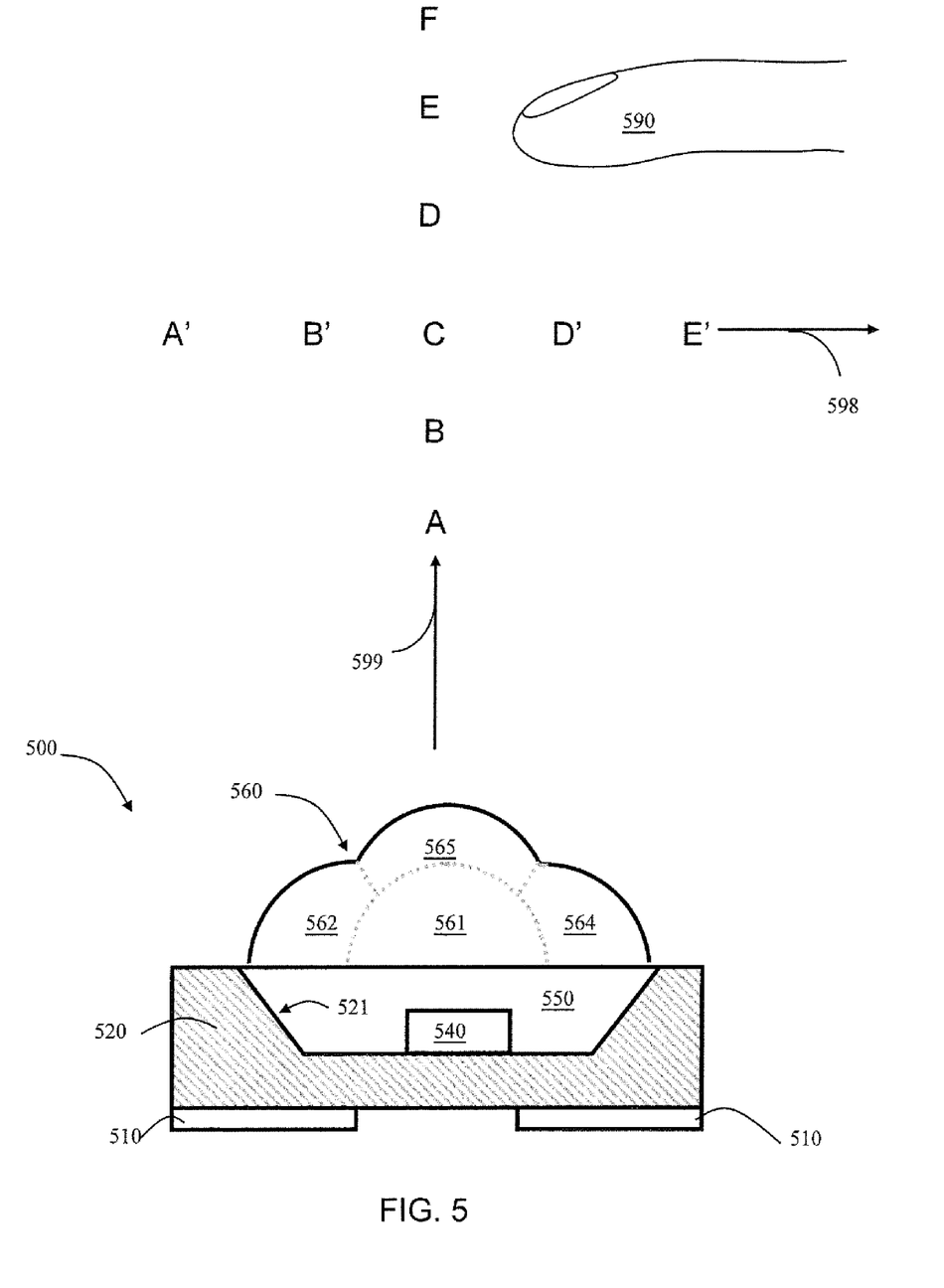
FIG. 5 illustrates a cross sectional view of a light source package incorporating a lens element with five lens sections.

FIG. 5 illustrates a cross sectional view of a light source package 500 incorporating a lens element 560 with five lens sections 561-565. The light source package 500 may comprise a body or a substrate 520, bond pads 510, lens element 560 having a base 550, and a light source die 540. A portion of the substrate 520 may define a reflective surface 521. The light source die 540 may be attached to the reflective surface 521 and encapsulated by the base 550. The light source package 500 may be configured to emit light along the optical axis 599 to illuminate any external object 590.

The top lens section 565 in the embodiment shown in FIG. 5 may be targeting to illuminate an object at position C. The lens sections 561-564 may be configured to direct light emitted from the light source die 540 to illuminate positions A, B, D, and E, respectively. Positions A-F may be located along the optical axis 599. Similar to FIG. 1, FIG. 5 is illustrated out of proportion to give emphasis on positions A-F, in order to enhance understanding. The positions A-F are much further away from the light source package 500. The positions A-F are not drawn to the correct scale. In actual size, the positions A-F and the external objects 590 are much further compared to the drawings in FIG. 5.

Figure 6:
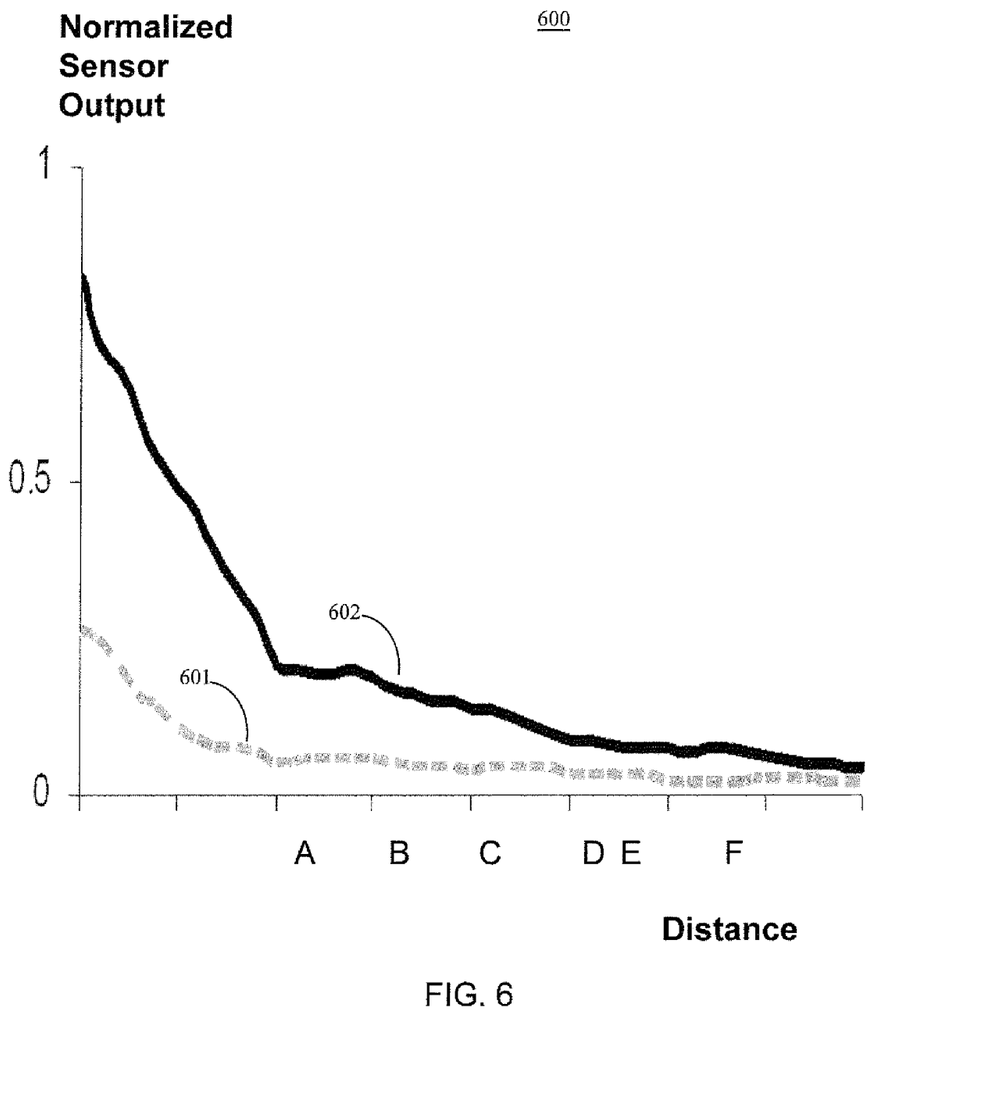
FIG. 6 shows a graph illustrating comparison of lens performance between a lens element with five lens sections and a single dome lens element by way of sensor output.

FIG. 6 shows simulation results plotting normalized sensor outputs for light sources using a different lens element 560. The simulation is based on a setup having the light source package 500 configured to emit light along the optical axis 599. A sensor 740 (See FIG. 7) is placed beside the light source package 500 to detect reflected light. The sensor's output is monitored when an external object 590 moves along the optical axis 599, for example from position A to F. The reading is plotted into curve 602 as shown in FIG. 6. The steps are repeated using a single dome lens 160 shown in FIG. 1 instead of the lens element 560 shown in FIG. 5 to obtain the curve 601 shown in FIG. 6. The x-axis of the graph 600 shown in FIG. 6 represents the distance of the external object 590 from the light source die 540 whereas the y-axis represents normalized sensor output.

Referring now to FIGS. 5 and 6. At any location along the optical axis 599, the light density detected using the light source package 500 with lens element 560 having five lens sections 561-565 is higher than another light source package 500 having a single dome lens element 160, as seen in FIG. 1. Therefore, the curve 602 is generally higher than the curve 601 as shown in FIG. 6. This indicates that the efficiency of the light source package 500 along the optical axis 599 is higher compared to the single dome lens element 160 shown in FIG. 1. This is because each of the lens sections 561-564 regulates light otherwise lost or emitted further away from the optical axis 599 to various locations along the optical axis 599.

The curve 601 is relatively flat between beyond position A. This may indicate that the external object 590 located further away from the position A cannot be detected. Therefore, the sensor output 601 may not be used to determined the existence of the external object 590 beyond position A as the readings shown for positions A-F or any position beyond position A is the same.

On the other hand, the curve 602 gradually reduces when the external object 590 moves from position A to position F. As the object moves beyond the position F, the curve 602 may become significantly flatter. From this result, it can be concluded that the detectability of external objects may be extended from position A to position F utilizing a lens with multiple domes.

For some applications, a wider detectability range may be preferred rather than concentrating along the optical axis 599. For such applications, the lens section 561-564 may be configured to redirect light towards target points A', B', D' and E' positioned at a planar 598 perpendicular to the optical axis 599. This may increase detectability when the external object 590 moves across the plane 598.

Figure 7:
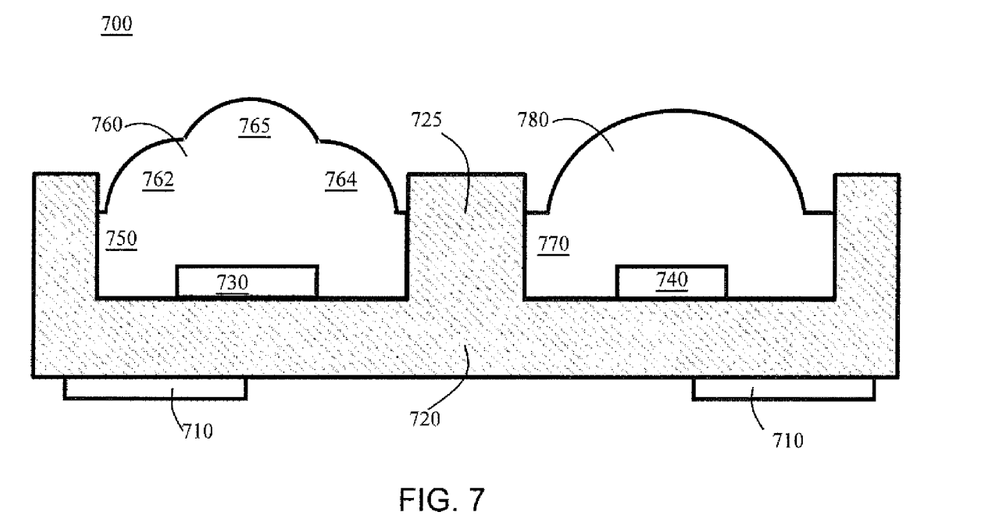
FIG. 7 illustrates a cross sectional view of a proximity sensor incorporating a lens element with five lens sections; and, FIG. 8 illustrates a cross sectional view of a proximity sensor incorporating a packaged LED with a lens element having five lens sections.

FIG. 7 illustrates a proximity sensor 700 incorporating a lens element with five lens sections 761-765, as shown in FIG. 2A. The proximity sensor 700 comprises a substrate 720, a transmitter die 730, a receiver die 740, bond pads 710, and lens elements 760 and 780. The lens element 760 comprises a base 750 encapsulating the transmitter die 730, and lens sections 761-765. Similarly, the lens element 780 comprises a base 770 encapsulating the receiver die 740. The proximity sensor 700 may be similar to the proximity sensor 100, shown in FIG. 1, except that the lens element 760 have multiple lens sections 761-765 instead of a single dome lens 160 shown in FIG. 1.

In order to prevent cross talk, a projecting portion, wall, or flange 725 of the substrate 720 may be extended between the emitter die 730 and the detector die 740, as shown in FIG. 7. The projecting portion, wall, or flange 725 may be opaque to prevent radiation emitting from the transmitter die 730 from being received directly at the receiver die 740 without reflection.

The lens element 200 with multiple lens sections 261-265, shown in FIG. 2 may be applied to the lens element 780 that encapsulates the receiver die 740. Depending on the designs requirement, the lens element 200 may be applied to both the lens elements 760 and 780. As shown in FIG. 7, the lens element 760 may be a lens element 200 with multiple lens sections 261-265, whereas the lens element 770 may be a single dome lens element 160 (See FIG. 1). Alternatively, in another embodiment, the lens element 780 for the receiver die 740 may have multiple lens sections 261-265.

Figure 8:
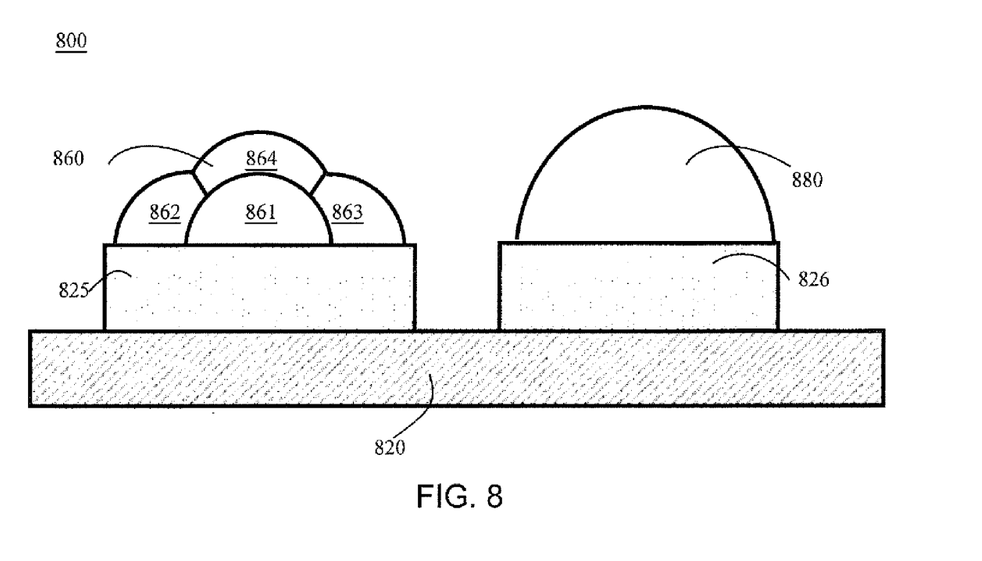

FIG. 8 shows a side view of a proximity sensor 800 constructed using discrete components, e.g. a packaged LED 825 and a packaged photo detector 826. Both the packaged LED 825 and the packaged photo detector 826 may be attached to a substrate 820. The substrate 820 may be a printed circuit board ("PCB"). The packaged LED 825 may be similar to the light source package 500, shown in FIG. 5. The packaged LED 825 may comprise a lens element 860 with multiple lens sections 861-864. The packaged photo detector 826 may comprise a single dome lens element 880 or the lens element 200 with multiple lens sections 261-265 as shown in FIGS. 2-5.

Although specific embodiments of the invention have been described and illustrated, the invention is not to be limited to the specific forms or arrangements of parts so described and illustrated. It is to be understood that the illustration and description shall not be interpreted narrowly. The scope of the invention is to be defined by the claims appended hereto and their equivalents.

What is claimed is:

1. A light source package having a die encapsulated by a lens element used for directing light along an optical axis, the lens element comprising:
   a base encapsulating the die;
   a plurality of lens sections formed above and planarly parallel to the base; wherein the plurality of lens sections comprise four lens sections having dome shape and the plurality of lens sections are positioned rotationally symmetric about the optical axis with successive lens sections being conjugated;
   a top lens section formed overlappingly above the lens sections and conjugating top portions of the lens sections; and,
   a filler section formed at intersections of the top lens section and the plurality of lens sections.

2. The light source package of claim 1, wherein the base, the plurality of lens sections, and the top lens section are coaxially aligned.

3. The light source package of claim 1, wherein the plurality of lens sections are configured to illuminate target points positioned at a planar perpendicular to the optical axis.

4. The light source package of claim 1, wherein the plurality of lens sections are configured to illuminate target points positioned along the optical axis.

5. The light source package of claim 1, wherein the lens element is fabricated from an optically transmissive material that encapsulates the lens element interior volume.

6. The light source package of claim 1, wherein the base has an extended portion forming a flange.

7. The light source package of claim 1, wherein all of the lens sections has similar size.

8. The light source package of claim 7, wherein the top lens has a diameter ranging between 0.2 to 5 times of the lens sections.

9. The light source package of claim 1, wherein the lens element forms a portion of a proximity sensor.

10. A proximity sensor having a substrate, a transmitter die for emitting light, a receiver die, a first lens element encapsulating the transmitter die, a second lens element encapsulating the receiver die, at least one of the first and second lens elements comprising:

a base;

a plurality of lens sections formed above and planarly parallel to the base, the plurality of lens sections being positioned rotationally symmetric about an optical axis perpendicular to the substrate with successive lens sections being conjugated;

a top lens section overlappingly above the lens sections and conjugating top portions of the plurality of lens sections; and, a filler section located at intersections of the top lens section and the plurality of lens sections;

wherein the plurality of lens sections comprise four lens sections having dome shape.

11. The proximity sensor of claim 10, wherein the base, the plurality of lens sections, and the top lens section are coaxially aligned.

12. The proximity sensor of claim 10, wherein the plurality of lens sections are configured to illuminate target points positioned along the optical axis.

13. The proximity sensor of claim 10, wherein the plurality of lens sections are configured to illuminate target points positioned at a surface parallel to the substrate.

14. The proximity sensor of claim 10, wherein the first and second lens element are fabricated from an optically transmissive material that encapsulates the first and second lens elements interior volume respectively.

15. The proximity sensor of claim 10, wherein all of the lens sections has similar size in diameter and the top lens has a diameter ranging between 0.2 to 5 times of the lens sections.

16. The proximity sensor of claim 10, wherein the other one of at least one of the first and the second lens element defines a dome shape.

17. The proximity sensor of claim 10, wherein the base has an extended portion forming a flange.

18. The proximity sensor of claim 10, wherein the first lens element and the transmitter die are housed in a first package; the second lens element and the receiver die are housed in a second package; and the first and second packages are attached to the substrate.

19. The proximity sensor of claim 10, wherein the plurality of lens sections are configured to redirect the light emitted from the transmitter die to a plurality of different target points distanced from the package.

* * * * *